(12) United States Patent
Matsuzaki

(10) Patent No.: US 11,836,001 B2
(45) Date of Patent: Dec. 5, 2023

(54) CIRCUIT DEVICE AND REAL-TIME CLOCK DEVICE

(71) Applicant: Seiko Epson Corporation, Tokyo (JP)

(72) Inventor: Sho Matsuzaki, Ina (JP)

(73) Assignee: SEIKO EPSON CORPORATION

( * ) Notice: Subject to any disclaimer, the term of this patent is extended or adjusted under 35 U.S.C. 154(b) by 0 days.

(21) Appl. No.: 17/386,899

(22) Filed: Jul. 28, 2021

(65) Prior Publication Data

US 2022/0035398 A1    Feb. 3, 2022

(30) Foreign Application Priority Data

Jul. 29, 2020    (JP) ................ 2020-128473

(51) Int. Cl.
*G06F 1/14*    (2006.01)
*G11C 7/04*    (2006.01)
*G11C 7/22*    (2006.01)

(52) U.S. Cl.
CPC ............. *G06F 1/14* (2013.01); *G11C 7/04* (2013.01); *G11C 7/222* (2013.01)

(58) Field of Classification Search
CPC ............. G06F 1/14; G11C 7/04; G11C 7/222
See application file for complete search history.

(56) References Cited

U.S. PATENT DOCUMENTS

| | | | | |
|---|---|---|---|---|
| 5,214,316 A * | 5/1993 | Nagai | .................. | H03K 17/223 327/143 |
| 6,686,783 B1 * | 2/2004 | Huang | ................. | H03K 17/223 327/143 |
| 7,251,178 B2 * | 7/2007 | Gogl | ....................... | G11C 11/16 365/158 |
| 7,492,225 B2 * | 2/2009 | Chiang | ............... | H03F 3/45197 330/257 |
| 8,373,696 B2 * | 2/2013 | Takashi | .................. | G09G 3/325 345/212 |
| 8,570,815 B2 * | 10/2013 | Nakaoka | ................ | G11C 7/065 365/189.11 |
| 9,899,065 B1 * | 2/2018 | Lee | .......................... | G11C 7/04 |
| 2004/0042251 A1 * | 3/2004 | Kang | ...................... | G11C 11/22 365/145 |
| 2006/0066453 A1 * | 3/2006 | Homanfar | ............ | G03B 42/047 340/686.2 |

(Continued)

FOREIGN PATENT DOCUMENTS

CN    107768369    *    3/2018
JP    H0734650 B2 *    4/1988    ........... A61B 6/5211

(Continued)

*Primary Examiner* — Sibin Chen
*Assistant Examiner* — James G Yeaman
(74) *Attorney, Agent, or Firm* — Harness, Dickey & Pierce, P.L.C.

(57) ABSTRACT

A circuit device includes a first power supply line to which a first power supply voltage is supplied, a second power supply line to which a second power supply voltage is supplied, a third power supply line, a power supply circuit, a predetermined circuit, a first power-on reset circuit, a second power-on reset circuit, and a reset control circuit. When a first power-on reset signal and a second power-on reset signal become a reset release level, the reset control circuit sets a third power-on reset signal output to at least a part of the predetermined circuit to a reset release level.

12 Claims, 10 Drawing Sheets

(56) References Cited

U.S. PATENT DOCUMENTS

| | | | |
|---|---|---|---|
| 2014/0008984 A1* | 1/2014 | Kamiyama | H02J 9/06 307/64 |
| 2017/0193777 A1* | 7/2017 | Salegh | G08B 13/2465 |
| 2020/0075080 A1* | 3/2020 | Sun | G11C 7/065 |
| 2020/0177191 A1* | 6/2020 | Furuya | H03B 5/1228 |

FOREIGN PATENT DOCUMENTS

| | | | |
|---|---|---|---|
| JP | H0734650 B2 * | 4/1995 | |
| JP | H0734650 B2 * | 4/1995 | |
| JP | 2006030136 * | 2/2006 | |
| JP | 5125605 B2 * | 1/2013 | |
| JP | 2014-017965 A | 1/2014 | |
| KR | 20090047700 A * | 5/2009 | |
| KR | 20090047700 A * | 5/2009 | |

\* cited by examiner

CIRCUIT DEVICE AND REAL-TIME CLOCK DEVICE

The present application is based on, and claims priority from JP Application Serial Number 2020-128473, filed Jul. 29, 2020, the disclosure of which is hereby incorporated by reference herein in its entirety.

BACKGROUND

1. Technical Field

The present disclosure relates to a circuit device, a real-time clock device, and the like.

2. Related Art

A power-on reset circuit that initializes the internal state of a circuit device by generating an internal reset signal when power is turned on or a power supply voltage drops in the circuit device is known.

JP-A-2014-017965 discloses that a circuit device including a switch circuit for switching between a main power supply and a backup power supply includes a power-on reset circuit that can be coupled to either the main power supply or the backup power supply.

Since it is desirable to hold each circuit in the circuit device in reset until a constant voltage is supplied, a minimum drive voltage is set. When the circuit device described in JP-A-2014-017965 is operated with low power consumption, for example, the voltage of the main power supply is set low, and the power-on reset circuit may not be operated appropriately.

SUMMARY

An aspect of the present disclosure relates to a circuit device including: a first power supply line to which a first power supply voltage is supplied, a second power supply line to which a second power supply voltage is supplied, a third power supply line, a power supply circuit that is coupled to the first power supply line and the second power supply line, performs selection of the first power supply voltage or the second power supply voltage, and outputs a third power supply voltage based on the selected power supply voltage to the third power supply line, a predetermined circuit that is operated by the third power supply voltage, a first power-on reset circuit that is coupled to the first power supply line and outputs a first power-on reset signal based on the first power supply voltage, a second power-on reset circuit that is coupled to the third power supply line and outputs a second power-on reset signal based on the third power supply voltage, and a reset control circuit that sets a third power-on reset signal output to at least a part of the predetermined circuit to a reset release level when the first power-on reset signal and the second power-on reset signal become a reset release level.

Another aspect of the present disclosure relates to a real-time clock device including the circuit device, and a resonator, in which the circuit device includes a regulator that generates the third power supply voltage from a power supply voltage output by selecting the first power supply voltage, and an oscillation circuit that generates a clock signal by oscillating the resonator, and the predetermined circuit includes a timekeeping circuit that performs timekeeping processing based on the clock signal.

DESCRIPTION OF EXEMPLARY EMBODIMENTS

Hereinafter, preferred embodiments of the present disclosure will be described in detail. It should be noted that the present embodiment described below does not unreasonably limit the contents described in the appended claims, and all the configurations described in the present embodiment are not necessarily essential constituent elements.

1. Basic Configuration

Figure 1:
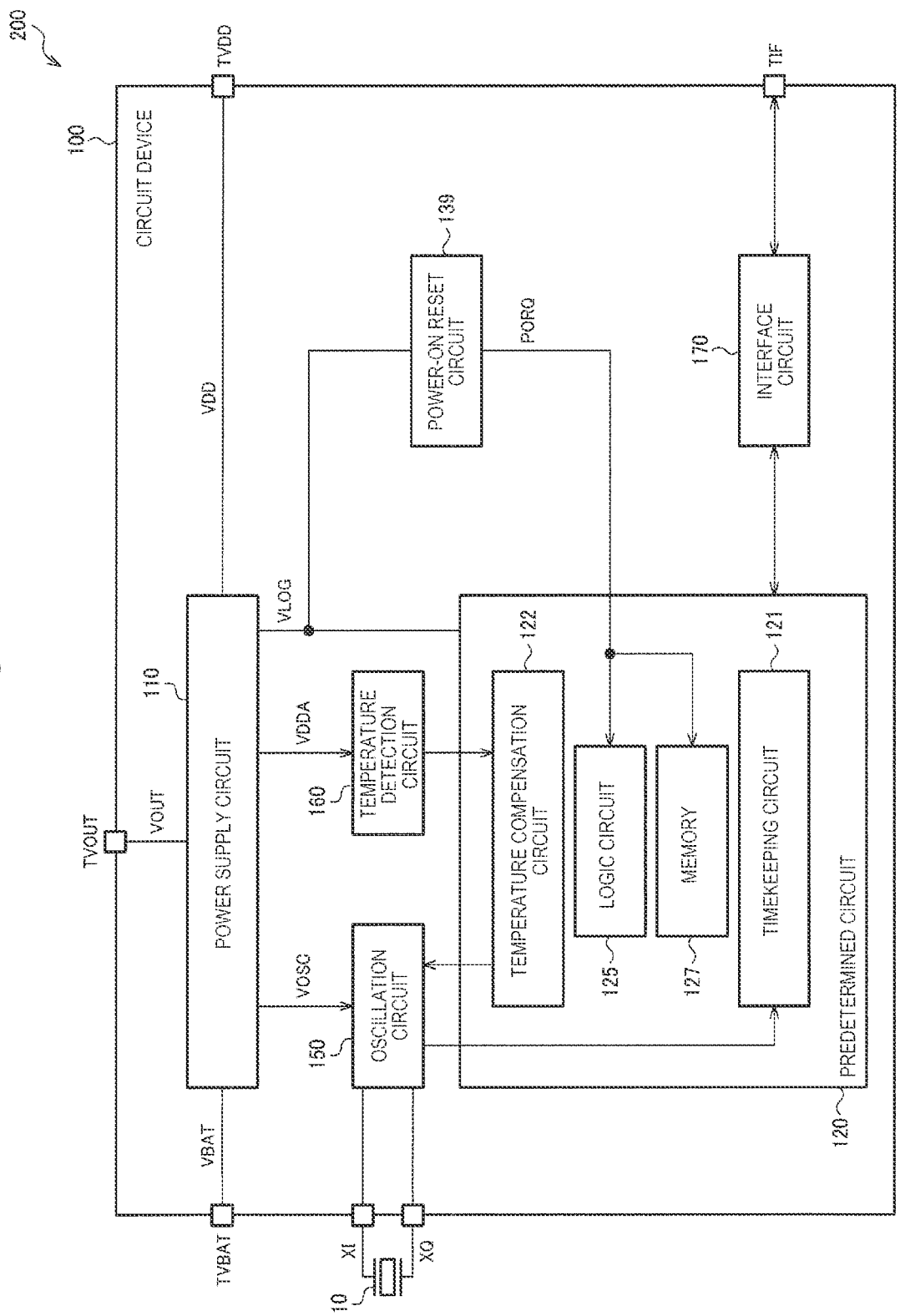
FIG. 1 is a diagram illustrating a comparative example.

FIG. 1 is a diagram illustrating a comparative example in which the method of JP-A-2014-017965 is applied to a circuit device 100 of the present embodiment as a basic configuration. The circuit device 100 includes a first power supply line to which a first power supply voltage VDD is supplied, a second power supply line to which a second power supply voltage VBAT is supplied, a third power supply line, a power supply circuit 110, and a predetermined circuit 120. The third power supply line is a power supply line to which a third power supply voltage VLOG is supplied by the power supply circuit 110. The same applies to the circuit device 100 of the present embodiment, which will be described later in FIG. 3. The configuration of the circuit device 100 is not limited to the above, and various modifications can be performed such as omitting some of the components or adding other components. For example, the circuit device 100 may include a power-on reset circuit 139 in addition to the above. Further, the circuit device 100 may further include an interface circuit 170. Further, the circuit device 100 may further include terminals TVDD, TVBAT, TVOUT, TIF, XI, and XQ. The terminals such as TVDD, TVBAT, TVOUT, TIF, XI, and XQ in the present embodiment are, for example, pads in the circuit device 100.

The power supply circuit 110 monitors the first power supply voltage VDD and the second power supply voltage VBAT, selects the first power supply voltage VDD and the second power supply voltage VBAT based on the monitoring results, and outputs the selected voltage as a fourth power supply voltage VOUT. The power supply line to which the fourth power supply voltage VOUT is supplied is referred to as a fourth power supply line. In other words, the power supply circuit 110 is coupled to the first power supply line and the second power supply line, and selects the first power supply voltage VDD or the second power supply voltage VBAT. The selection operation of the first power supply voltage VDD and the second power supply voltage VBAT can be realized by using, for example, a transistor that functions as a switch, and the details will be described later. The coupling in the present embodiment is an electrical coupling. The electrical coupling is a coupling in which an electric signal can be transmitted, and is a coupling in which information can be transmitted by the electric signal. The electrical coupling may be a coupling via an active element or the like. A stabilizing capacitor (not illustrated) for stabilizing the fourth power supply voltage VOUT is coupled to the terminal TVOUT. The power supply circuit 110 outputs a power supply voltage VOSC to an oscillation circuit 150 described later, based on the fourth power supply voltage VOUT, outputs a power supply voltage VDDA to a temperature detection circuit 160 described later, and outputs the third power supply voltage VLOG to the predetermined circuit 120. In other words, the power supply circuit 110 outputs the third power supply voltage VLOG based on the selected power supply voltage to the third power supply line. The power supply circuit 110 also outputs the third power supply voltage VLOG to the power-on reset circuit 139.

The predetermined circuit 120 is operated by the third power supply voltage VLOG input from the power supply circuit 110 described above. In other words, the predetermined circuit 120 is operated by the third power supply voltage VLOG. The predetermined circuit 120 includes, for example, a logic circuit 125 and a memory 127, and the details will be described later. Further, the predetermined circuit 120 communicates with a processor via the interface circuit 170. The interface circuit 170 is coupled to the processor via the terminal TIF. Although the terminal TIF is omitted as one in FIG. 1, a plurality of terminal TIFs are actually provided for the interface. A power-on reset signal PORQ is input to the predetermined circuit 120 from the power-on reset circuit 139, and then reset or release from reset is executed by the power-on reset signal PORQ.

The operation lower limit voltage is defined for the logic circuit 125 and the memory 127 here, and an operation lower limit voltage VOLM for the memory 127 is a specification higher than an operation lower limit voltage VOLL for the logic circuit 125. In accordance with this assumption, the operation at the time of initial startup in the comparative example in which the method of JP-A-2014-017965 is applied to the circuit device 100 will be described with reference to the waveform diagram of FIG. 2. The length of the vertical axis in FIG. 2 does not indicate a specific magnitude of voltage, and the length of the horizontal axis does not indicate a specific length of time. The same applies to FIGS. 9, 10, and 11 described later.

After the first power supply voltage VDD is applied to the circuit device 100, the fourth power supply voltage VOUT and the third power supply voltage VLOG increase following the power supply voltage VDD. Then, at the timing illustrated in A1, the logic level of the power-on reset signal PORQ changes from a low level to a high level. That is, the power-on reset circuit 139 outputs the power-on reset signal PORQ indicating release from reset at the timing illustrated in A1. Here, in the present embodiment, it is assumed that when the power-on reset signal is at a low level, the circuit to which the power-on reset signal is input is reset, and when the power-on reset signal becomes at a high level, the circuit to which the power-on reset signal is input is released from reset.

Figure 2:
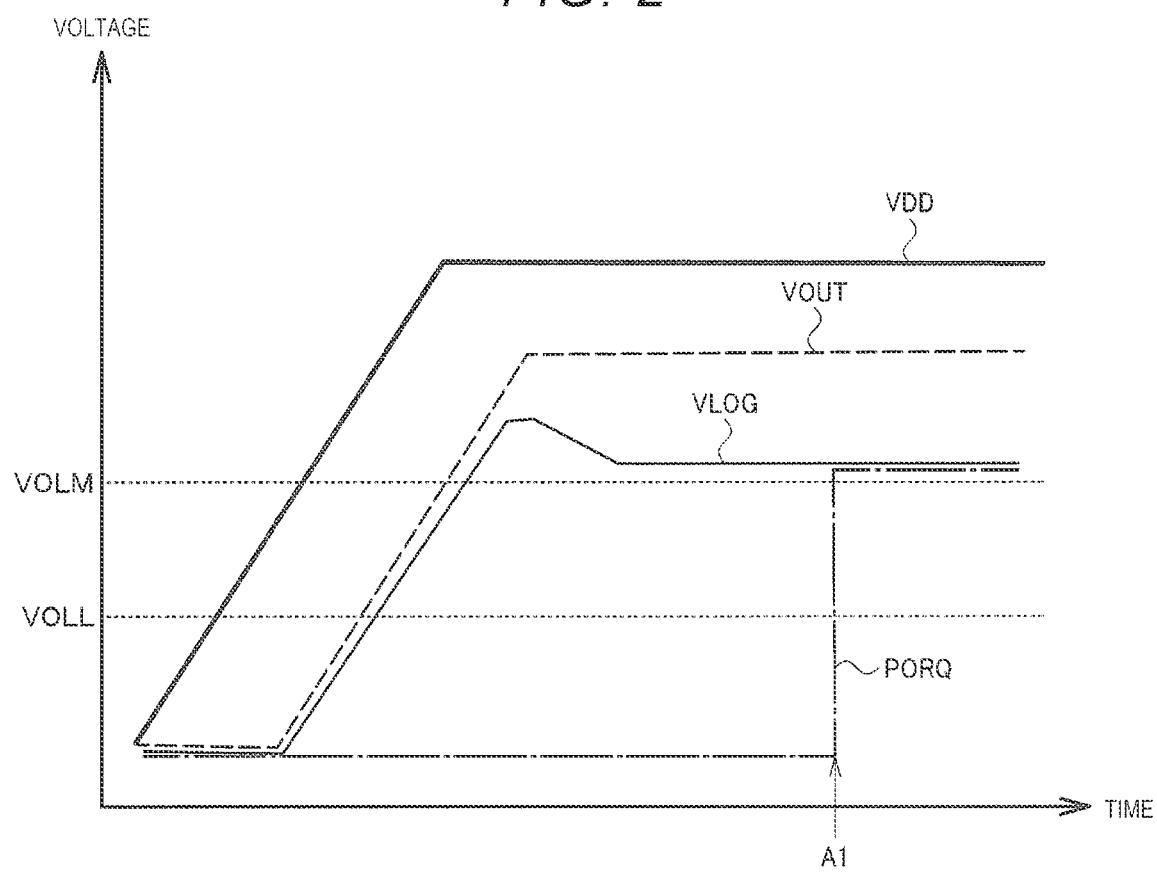
FIG. 2 is a waveform diagram illustrating an operation example in the comparative example.

Although not illustrated in FIG. 2, it is assumed that the logic level of the power-on reset signal PORQ is fixed to a low level at a timing before the timing illustrated in A1, and the description of at what timing the power-on reset signal PORQ is fixed at a low level will be omitted. The same applies to a first power-on reset signal PORQ1 and a second power-on reset signal PORQ2 illustrated in FIGS. 9 to 11 described later.

In FIG. 2, since it is assumed that the first power supply voltage VDD is set sufficiently high to operate the circuit device 100 as described above, at the timing A1, the voltage of the third power supply voltage VLOG becomes higher than both the operation lower limit voltage VOLL of the logic circuit 125 and the operation lower limit voltage VOLM of the memory 127, and no inconvenience occurs. In other words, if it is possible to set the first power supply voltage VDD sufficiently high, it is possible to appropriately operate the power-on reset circuit 139 to which the third power supply voltage VLOG is supplied. Here, the appropriate operation of the power-on reset circuit means that the power-on reset circuit appropriately outputs a power-on reset signal indicating release from reset when the power supply voltage becomes an expected voltage level.

However, in operating the circuit device 100, a situation may occur in which the first power supply voltage VDD cannot be set high. Therefore, there is a possibility that the power-on reset circuit 139 coupled to the third power supply voltage VLOG cannot be operated appropriately. The situation in which the first power supply voltage VDD cannot be set high is, for example, a situation in which it is desired to use a system including the circuit device 100 with low power consumption, but also includes a situation in which the circuit device 100 is initially started by using the second power supply voltage VBAT, and the details will be described in FIG. 9. Further, the system here includes a processor which is a host device of a real-time clock device 200 described later, and the processor is operated by the first power supply voltage VDD.

Therefore, as will be described in detail with reference to FIG. 3 described later, the circuit device 100 of the present embodiment further includes a first power-on reset circuit 190, a second power-on reset circuit 130, and a reset control circuit 129. The first power-on reset circuit 190 is coupled to the first power supply line and outputs the first power-on reset signal PORQ1 based on the first power supply voltage VDD. The second power-on reset circuit 130 is coupled to the third power supply line and outputs the second power-on reset signal PORQ2 based on the third power supply voltage VLOG. When the first power-on reset signal PORQ1 and the second power-on reset signal PORQ2 become a reset release level, the reset control circuit 129 sets a third power-on reset signal PORQ3 output to at least a part of the predetermined circuit 120 to a reset release level.

By doing so, it is possible to execute the power-on reset operation appropriately even in a situation in which the first power supply voltage VDD from the main power supply cannot be set high or in a situation where a battery is used first for initial startup.

Further, the circuit device 100 of the present embodiment may be a circuit device of the real-time clock device 200 including a resonator 10, the oscillation circuit 150, and a timekeeping circuit 121. In other words, the real-time clock device 200 of the present embodiment includes the circuit device 100 and the resonator 10. The circuit device 100 includes VLOG_REG 153, which is a regulator that generates the third power supply voltage VLOG from the power supply voltage output by selecting the first power supply voltage VDD, and the oscillation circuit 150 that generates a clock signal by oscillating the resonator 10, and the predetermined circuit 120 includes the timekeeping circuit 121 that performs timekeeping processing based on the clock signal. The regulator VLOG_REG 153 will be described later with reference to FIG. 5.

The oscillation circuit 150 oscillates the resonator 10. For example, the oscillation circuit 150 is electrically coupled to the terminal XI and the terminal XQ and generates an oscillation signal by oscillating the resonator 10. For example, the oscillation circuit 150 drives the resonator 10 via a signal line coupled to the terminal XI and the terminal XQ to oscillate the resonator 10. For example, the oscillation circuit 150 includes a drive circuit for oscillation provided between the terminal XI and the terminal XQ. For example, the oscillation circuit 150 can be realized by a transistor such as a bipolar transistor that realizes a drive circuit and an active element such as a capacitor or a resistor. As the oscillation circuit 150, various types of oscillation circuit such as Pierce type, Colpitts type, inverter type, and Hartley type can be used. Further, the oscillation circuit 150 can include a variable capacitance circuit (not illustrated), and the oscillation frequency can be adjusted by adjusting the capacitance of the variable capacitance circuit.

The timekeeping circuit 121 performs timekeeping processing based on the clock signal generated by the oscillation circuit 150 to generate timekeeping information. The timekeeping circuit 121 has a counter that performs a counting operation based on a clock signal and outputs data of the count value of the counter as timekeeping information. The timekeeping information is information indicating the current time of the system. For example, after the real-time clock device 200 is started and initialized, it is possible to write timekeeping information such as the current time from the processor and read timekeeping information such as the current time to the processor via the interface circuit 170.

The resonator 10 generates mechanical vibration by an electric signal. The resonator 10 can be realized by a resonator element such as a quartz crystal resonator element. For example, the resonator 10 can be realized by a quartz crystal resonator element having a cut angle of AT cut, SC cut, or the like that vibrates in the thickness shear mode. For example, the resonator 10 is a resonator built in a temperature compensated crystal oscillator (TCXO) that does not have a thermostatic oven, but may be a resonator built in an oven-controlled crystal oscillator (OCXO) that has a thermostatic oven. The resonator 10 of the present embodiment can be realized by various resonator elements such as a resonator element other than the thickness shear vibration type and a piezoelectric resonator element made of a material other than quartz crystal. For example, as the resonator 10, a surface acoustic wave (SAW) resonator, a micro electro mechanical systems (MEMS) resonator as a silicon resonator formed by using a silicon substrate, or the like may be adopted.

By doing so, the circuit device 100 of the present embodiment can be applied to the real-time clock device 200.

The real-time clock device 200 of the present embodiment may further include a temperature detection circuit 160 and a temperature compensation circuit 122. Specifically, as illustrated in FIG. 1, this can be realized by including the temperature detection circuit 160 in the circuit device 100 and the temperature compensation circuit 122 in the predetermined circuit 120.

The temperature compensation circuit 122 outputs temperature compensation data for making the oscillation frequency of the oscillation circuit 150 constant regardless of the temperature, based on the temperature detection data output by the temperature detection circuit 160. By extracting the temperature compensation data corresponding to the temperature from a lookup table that tabulates the temperature characteristics of the oscillation frequency or by substituting the temperature into a polynomial function that approximates the temperature characteristics of the oscillation frequency, the temperature compensation circuit 122 outputs the temperature compensation data. The lookup table may be stored in the memory 127, for example.

The temperature detection circuit 160 includes a temperature sensor and an A/D conversion circuit and is operated by the power supply voltage VDDA. The temperature sensor uses the temperature dependence of the forward voltage in a diode to output a temperature-dependent temperature detection voltage. The A/D conversion circuit converts the temperature detection voltage from analog into digital to output temperature detection data.

By doing so, since it is possible to compensate the temperature even if the resonator 10 has a temperature dependence, it is possible to operate the real-time clock device 200 more appropriately.

2. Method of Present Embodiment

Next, the details of the circuit device 100 of the present embodiment will be described. FIG. 3 is a diagram illustrating a configuration example of the circuit device 100 of the present embodiment. The circuit device 100 of the present embodiment includes a first power supply line to which the first power supply voltage VDD is supplied, the second power supply line to which the second power supply voltage VBAT is supplied, the third power supply line, a power supply circuit 110, and a predetermined circuit 120. Further, the power supply circuit 110 is coupled to the first power supply line and the second power supply line, performs selection of the first power supply voltage VDD or the second power supply voltage VBAT, and outputs the third power supply voltage VLOG based on the selected power supply voltage to the third power supply line. Further, the predetermined circuit 120 is operated by the third power supply voltage VLOG. These are the same as the above-mentioned comparative example.

Further, the circuit device 100 of the present embodiment further includes the first power-on reset circuit 190 and the second power-on reset circuit 130. The details will be described later with reference to FIG. 7, but the first power-on reset circuit 190 outputs the first power-on reset signal PORQ1 based on the first power supply voltage VDD, a first reference voltage VREF1, and the like. In other words, the first power-on reset circuit 190 is coupled to the first power supply line and outputs the first power-on reset signal PORQ1 based on the first power supply voltage VDD. Further, as will be described in detail later in FIG. 8, the second power-on reset circuit 130 outputs the second power-on reset signal PORQ2 based on a second reference voltage VREF2, the third power supply voltage VLOG, and the like. In other words, the second power-on reset circuit 130 is coupled to the third power supply line and outputs the second power-on reset signal PORQ2 based on the third power supply voltage VLOG.

Further, the circuit device 100 of the present embodiment further includes the reset control circuit 129. Specifically, the circuit device 100 can be realized by including the reset control circuit 129 in the predetermined circuit 120. A specific circuit configuration example of the reset control circuit 129 will be described later with reference to FIG. 4. The first power-on reset signal PORQ1 output from the first power-on reset circuit 190 and the second power-on reset signal PORQ2 output from the second power-on reset circuit 130 are input to the reset control circuit 129. Then, when the first power-on reset signal PORQ1 and the second power-on reset signal PORQ2 are both reset release level signals, the reset control circuit 129 outputs the third power-on reset signal PORQ3 to at least a part of the predetermined circuit 120. The reset release level is, for example, a high level. In other words, when the first power-on reset signal PORQ1 and the second power-on reset signal PORQ2 become a reset release level, the reset control circuit 129 sets the third power-on reset signal PORQ3 output to at least a part of the predetermined circuit 120 to a reset release level. By doing so, in a predetermined situation, since it is possible to release a part of the circuit from reset after the first power-on reset signal PORQ1 from the first power-on reset circuit 190 becomes a reset release level, it is possible to execute the power-on reset operation appropriately. As described above, the predetermined situation is a situation in which it is desired to use the system including the circuit device 100 with low power consumption, or a situation in which the circuit device 100 is initially started by using the second power supply voltage VBAT.

Next, the logic circuit 125 and the memory 127 will be described in detail. As described above, the logic circuit 125 and the memory 127 are included in the predetermined circuit 120. The logic circuit 125 controls each part of the circuit device 100. For example, the logic circuit 125 stores the above-mentioned temperature compensation data in the memory 127 and controls the temperature compensation circuit 122 based on the temperature compensation data. In other words, the predetermined circuit 120 includes the memory 127 and the logic circuit 125 that performs processing based on the data from the memory 127.

It is possible to control the power supply circuit 110 by the predetermined circuit 120 being released from reset. Therefore, at the time of initial startup, a switch circuit 111 described later remains off.

The memory 127 stores data required for the circuit device 100. The required data is, for example, the temperature compensation data described above. The memory 127 can be realized by, for example, a non-volatile memory. The non-volatile memory is, for example, an electrically erasable programmable read only memory (EEPROM) or a flash memory. EEPROM can be realized by, for example, a floating gate type memory cell. The flash memory can be realized by, for example, a memory cell of metal oxide nitride oxide silicon (MONOS).

Figure 3:
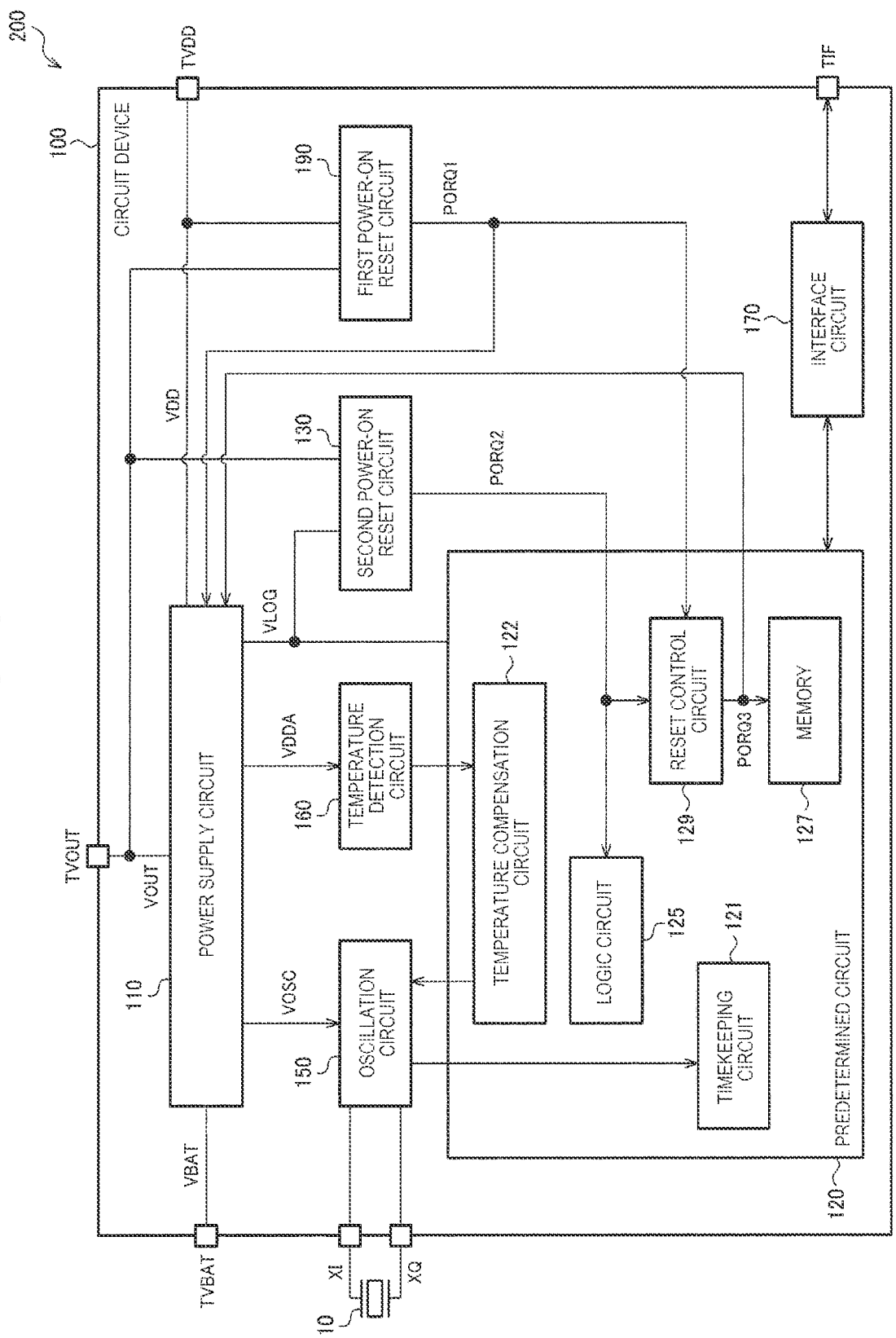
FIG. 3 is a diagram illustrating a configuration example of a circuit device of the present embodiment.

As illustrated in FIG. 3, the memory 127 receives the third power-on reset signal PORQ3 from the reset control circuit 129 described above. In other words, the third power-on reset signal PORQ3 is input to the memory 127. That is, the above-mentioned part of the circuit is, for example, the memory 127. By doing so, when it is desired to start the memory 127 later at the initial startup, since it is possible to release the memory 127 from reset only after the third power-on reset signal PORQ3 is input, it is possible to perform the power-on reset operation appropriately. The case where it is desired to start the memory 127 later at the initial startup is, for example, the case where the operation lower limit voltage of the memory 127 is high, but may be other cases. Further, the above-mentioned part of circuits are not limited to the memory 127 and may be other circuits.

Further, similarly to the above-mentioned comparative example, the logic circuit 125 is operated by the third power supply voltage VLOG, but requires a voltage equal to or higher than the operation lower limit voltage VOLL, which is a first operation lower limit voltage in order for the logic circuit 125 to operate. Similarly, the memory 127 is operated by the third power supply voltage VLOG, but requires a voltage equal to or higher than the operation lower limit voltage VOLM, which is a second operation lower limit voltage. The second operation lower limit voltage VOLM has a specification higher than that of the first operation lower limit voltage VOLL described above. In other words, the first operation lower limit voltage VOLL, which is the operation lower limit voltage of the logic circuit 125, is lower than the second operation lower limit voltage VOLM, which is the operation lower limit voltage of the memory 127.

Further, as illustrated in FIG. 3, the logic circuit 125 is reset or released from reset based on the second power-on reset signal PORQ2 output from the second power-on reset circuit 130. In other words, the second power-on reset signal PORQ2 is input to the logic circuit 125. By doing so, since it is possible to release the logic circuit 125 having a low operation lower limit voltage from reset based on the second power-on reset signal PORQ2, and then release the memory 127 having a high operation lower limit voltage from reset, it is possible to perform the power-on reset operation appropriately.

Figure 4:
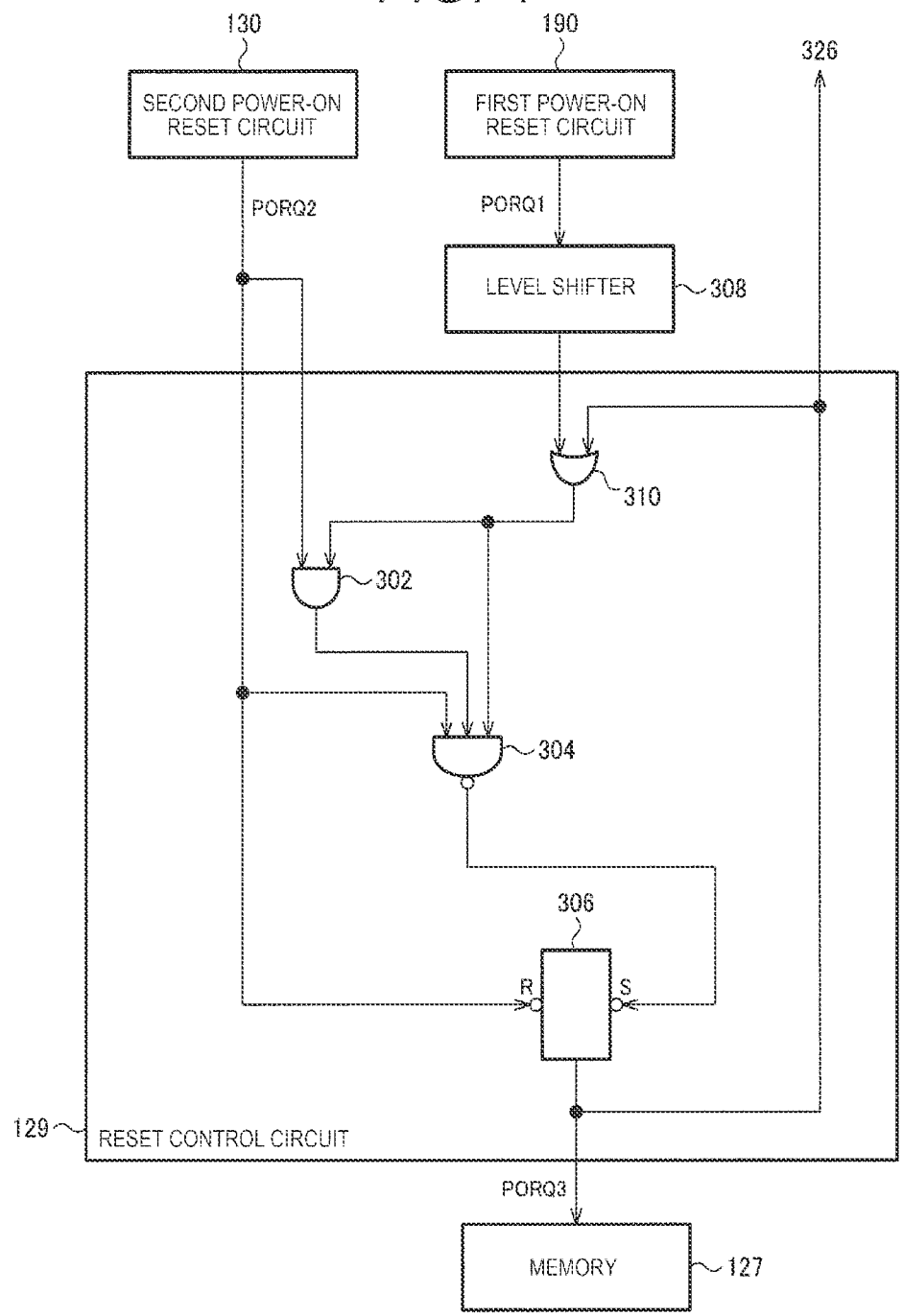
FIG. 4 is a diagram illustrating a detailed configuration example of a reset control circuit.

Next, a detailed configuration example of the reset control circuit 129 will be described with reference to FIG. 4. The reset control circuit 129 includes an AND circuit 302, a NAND circuit 304, an RS type flip-flop circuit 306, and an OR circuit 310. The first power-on reset signal PORQ1 from the first power-on reset circuit 190 is input to one input terminal of the OR circuit 310 after voltage adjustment via a level shifter 308. The third power-on reset signal PORQ3 described later is input to the other input terminal of the OR circuit 310. The second power-on reset signal PORQ2 from the second power-on reset circuit 130 and the output signal of the OR circuit 310 described above are input to the AND circuit 302. The second power-on reset signal PORQ2 from the second power-on reset circuit 130, the output signal of the OR circuit 310, and the output signal of the AND circuit 302 are input to the NAND circuit 304. The second power-on reset signal PORQ2 from the second power-on reset circuit 130 is input to the reset terminal of the RS type flip-flop circuit 306, and the output signal of the NAND circuit 304 is input to the set terminal of the RS type flip-flop circuit 306.

When the second power-on reset signal from the second power-on reset circuit 130 is at a low level, the RS type flip-flop circuit 306 is reset, whereby the third power-on reset signal PORQ3 output by the RS type flip-flop circuit 306 becomes a low level, which is a reset level. Then, when the first power-on reset signal PORQ1 from the first power-on reset circuit 190 becomes a high level and the second power-on reset signal PORQ2 from the second power-on reset circuit 130 becomes a high level, the output signal of the NAND circuit 304 becomes a low level. As a result, the RS type flip-flop circuit 306 is reset, and the third power-on reset signal PORQ3 output by the RS type flip-flop circuit becomes a high level which is a reset release level. The memory 127 to which the third power-on reset signal PORQ3 is input is released from reset.

When the third power-on reset signal PORQ3 becomes a high level, the output signal of the OR circuit 310 is fixed at a high level, whereby the output signal of the AND circuit 302 is also fixed at a high level. As a result, the output signal of the NAND circuit 304 is fixed at a low level, and the RS type flip-flop circuit 306 is held in reset. Therefore, even if the third power-on reset signal PORQ3 becomes a high level and then, for example, the first power supply voltage VDD drops and the first power-on reset signal PORQ1 becomes a low level, the third power-on reset signal PORQ3 is held at a high level.

Figure 5:
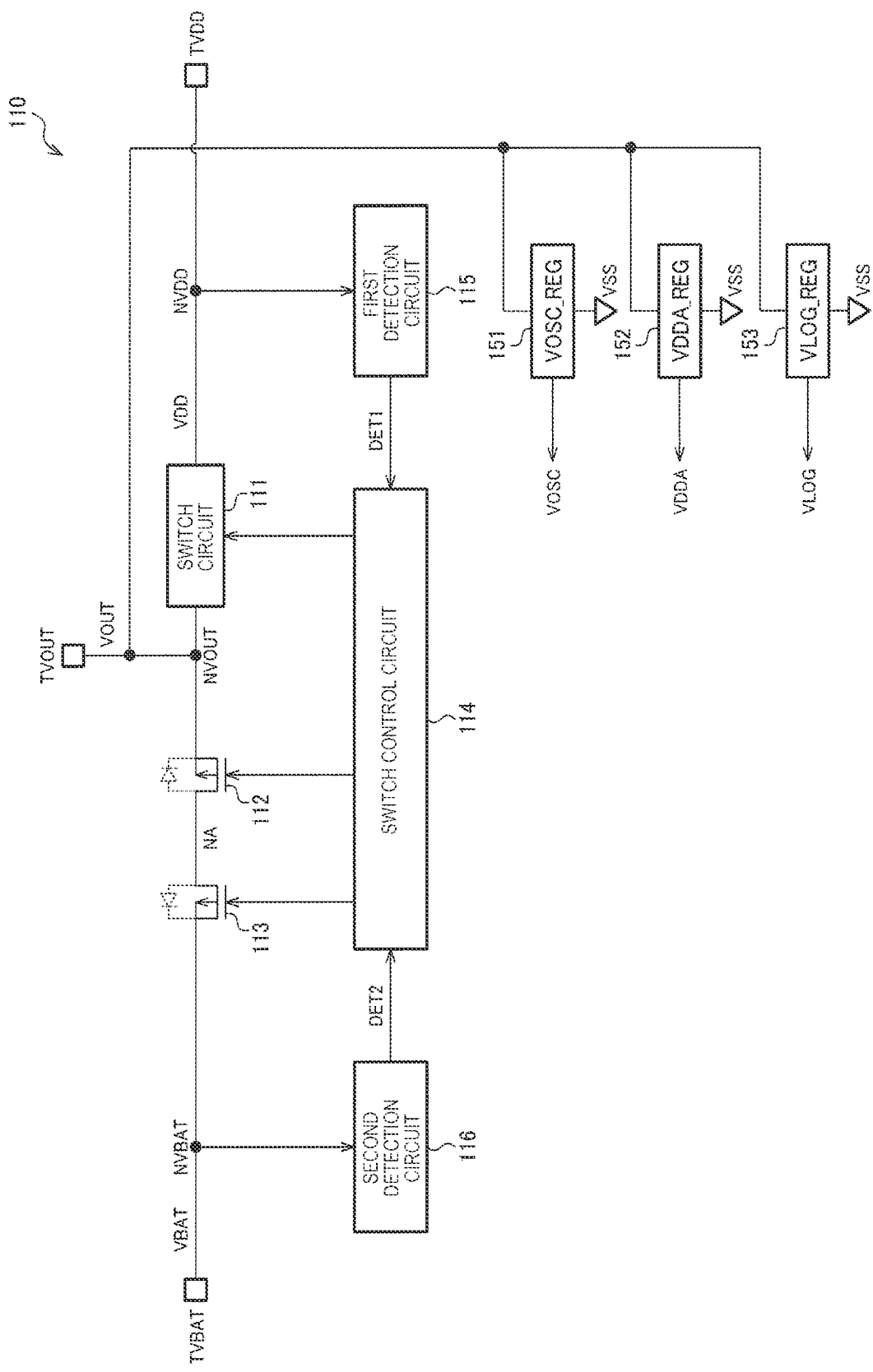
FIG. 5 is a diagram illustrating a detailed configuration example of a power supply circuit.

Next, a detailed configuration example of the power supply circuit 110 will be described with reference to FIG. 5. The power supply circuit 110 includes the switch circuit 111, P-type transistors 112 and 113, a switch control circuit 114, a first detection circuit 115, a second detection circuit 116, a regulator VOSC_REG 151, a regulator VDDA_REG 152, and a regulator VLOG_REG 153. The details of the switch circuit 111 will be described later in FIG. 6.

For example, the first power supply voltage VDD is supplied to the terminal TVDD from the power supply of an external system. In other words, the first power supply voltage VDD is an external power supply voltage input from the outside. The external system is, for example, a system including the above-mentioned real-time clock device 200, but may be another system. The first detection circuit 115 detects whether or not the first power supply voltage VDD of a node NVDD, which is a power supply voltage node, is lower than a first detection voltage, and outputs the result as a first detection signal DET1 to the switch control circuit 114. The first detection circuit 115 includes a resistance voltage dividing circuit that divides the first power supply voltage VDD, and a comparator that compares the divided voltage with the first detection voltage. The second detection circuit 116 detects whether or not the second power supply voltage VBAT of a node NVBAT, which is a battery voltage node, is lower than a second detection voltage, and outputs the result as a second detection signal DET2 to the switch control circuit 114.

A battery is coupled to the terminal TVBAT, and a second power supply voltage VBAT is supplied from the battery. In other words, the second power supply voltage VBAT is a battery power supply voltage input from the battery. The battery may be a secondary battery or a primary battery, and serves as a backup power supply for the above-mentioned system. That is, when the first power supply voltage VDD is not supplied and the system processor does not operate, the system is operated by the second power supply voltage VBAT. The second detection circuit 116 includes a resistance voltage dividing circuit that divides the second power supply voltage VBAT, and a comparator that compares the divided voltage with the second detection voltage. The first detection voltage and the second detection voltage are generated by, for example, a voltage generation circuit (not illustrated).

By configuring the first power supply voltage VDD and the second power supply voltage VBAT in this way, it is possible to output the third power supply voltage VLOG based on the second power supply voltage VBAT even if the voltage of the first power supply voltage VDD drops, and it is possible to execute the power-on reset operation of the circuit device 100 appropriately.

The switch control circuit 114 controls the switch circuit 111 and the P-type transistors 112 and 113 on or off based on the first detection signal DET1 and the second detection signal DET2. That is, the P-type transistors 112 and 113 serve as switches. One of the source or drain of the P-type transistor 112 is coupled to a node NA, and the other of the source or drain and the back gate are coupled to a node NVOUT. One of the source or drain of the P-type transistor 113 is coupled to the node NA, and the other of the source or drain and the back gate are coupled to the node NVBAT. The diode illustrated by the dotted line in the P-type transistors 112 and 113 is a parasitic diode generated between one of the source or drain and the back gate. At the time of initial operation, the switch circuit 111 and the P-type transistor 112 are off, the P-type transistor 113 is on, and power is supplied from the first power supply voltage VDD or the second power supply voltage VBAT.

Figure 6:
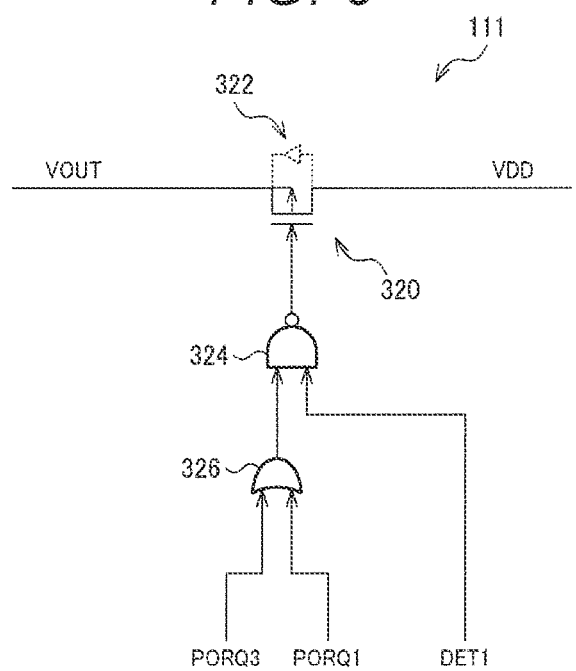
FIG. 6 is a diagram illustrating a detailed configuration example of a switch circuit.

Next, a detailed configuration example of the switch circuit 111 will be described with reference to FIG. 6. The switch circuit 111 includes a P-type transistor 320 and a parasitic diode 322 illustrated by the dotted line. One of the source or drain of the switch circuit 111 is coupled to the node NVDD, and the other of the source or drain is coupled to the node NVOUT. The node NVOUT is a node on the fourth power supply line described above in the comparative example. In other words, the circuit device of the present embodiment includes the fourth power supply line to which the fourth power supply voltage VOUT, which is a power supply voltage based on selection, is supplied. Further, as illustrated in FIG. 6, the switch circuit 111 is disposed between the first power supply line for supplying the first power supply voltage VDD and the node NVOUT on the fourth power supply line. In other words, the power supply circuit 110 includes the switch circuit 111 provided between the first power supply line and the fourth power supply line.

Further, as illustrated in FIG. 6, the parasitic diode 322 has a forward direction from the first power supply line to the fourth power supply line. In other words, the switch circuit 111 includes the diode 322 whose forward direction is from the first power supply line to the fourth power supply line. By doing so, it is possible to continue to supply power to the predetermined circuit 120 or the like by passing a current from the first power supply line side to the fourth power supply line regardless of whether the switch circuit is on or off and to perform an appropriate power-on reset operation. As a result, it is possible to apply the circuit device 100 to the system or the like including the real-time clock device 200.

Returning to FIG. 5, the regulators VOSC_REG 151, VDDA_REG 152, and VLOG_REG 153 will be described. The power supply circuit 110 includes the regulators VOSC_REG 151, VDDA_REG 152, and VLOG_REG 153. VOSC_REG 151 generates the power supply voltage VOSC by regulating the fourth power supply voltage VOUT and outputs the power supply voltage VOSC to the oscillation circuit 150. VDDA_REG 152 generates the power supply voltage VDDA by regulating the fourth power supply voltage VOUT and outputs the power supply voltage VDDA to the temperature detection circuit 160. The regulator VLOG_REG 153 generates the third power supply voltage VLOG by regulating the fourth power supply voltage VOUT. Further, as described above, the node NVOUT is coupled to one input terminal of the switch circuit 111, and the other input terminal of the switch circuits 111 is coupled to the first power supply line for supplying the first power supply voltage VDD. Further, VLOG_REG 153 outputs the third power supply voltage VLOG to the predetermined circuit 120. In other words, one end of the switch circuit 111 is coupled to the first power supply line, and the power supply circuit 110 includes VLOG_REG 153, which is a regulator whose input node is coupled to the other end of the switch circuit 111 and outputs the third power supply voltage VLOG from the output node. The regulators VOSC_REG 151, VDDA_REG 152, and VLOG_REG 153 can be realized by, for example, a linear regulator including an operational amplifier and a resistor.

By configuring the regulator VLOG_REG 153 in this way, it is possible to generate the third power supply voltage VLOG at a desired voltage based on the first power supply voltage VDD, and it is possible to perform an appropriate power-on reset operation.

Returning to FIG. 6, the description of the switch circuit 111 will be continued. The output signal of the NAND circuit 324 is input to the gate of the switch circuit 111. Further, the first detection signal DET1 is input to one input terminal of the NAND circuit 324, and the output signal of the OR circuit 326 is input to the other input terminal. The first detection signal DET1 outputs a high level signal when a power supply voltage higher than the first detection voltage is detected by turning on the initial power supply from the first power supply voltage VDD. Further, the first power-on reset signal PORQ1 is input to one input terminal of the OR circuit 326, and the third power-on reset signal PORQ3 is input to the other input terminal. As a result, when the first power-on reset signal PORQ1 becomes a high level, the switch circuit 111 is turned on from off by NAND with a high level of the first detection signal DET1. In other words, the switch circuit 111 is turned from off to on when the first power-on reset signal PORQ1 becomes a reset release level. By doing so, the fourth power supply voltage VOUT rises so as to be equal to the first power supply voltage VDD, and therefore the third power supply voltage VLOG can also rise. As a result, since it is possible to release the predetermined circuit 120 from reset after supplying a voltage higher than the operation lower limit voltage of each circuit in the predetermined circuit 120, it is possible to perform an appropriate power-on reset operation. A specific operation example will be described later.

Figure 7:
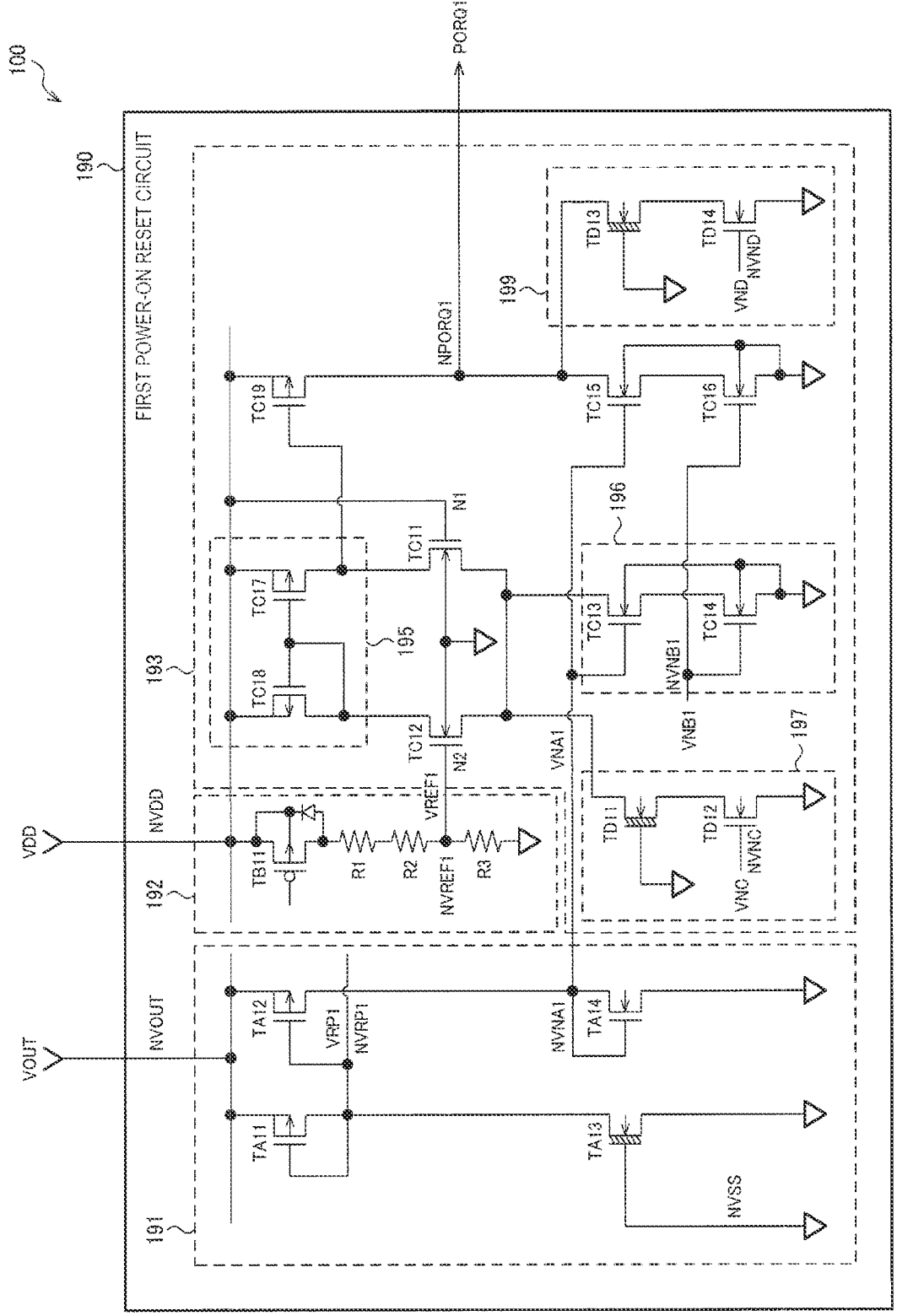
FIG. 7 is a diagram illustrating a configuration example of a first power-on reset circuit.

Next, the first power-on reset circuit 190 will be described with reference to FIG. 7. The first power-on reset circuit 190 includes a first bias circuit 191, a first reference voltage generation circuit 192, and a first comparator 193.

The fourth power supply voltage VOUT is supplied to the first bias circuit 191. The first bias circuit 191 generates a bias voltage VNA1 based on the fourth power supply voltage VOUT and outputs a bias voltage VNA1 to the first comparator 193. The first bias circuit 191 includes P-type transistors TA11 and TA12, a depletion-type N-type transistor TA13, and an N-type transistor TA14. Transistors not mentioned as depletion type are enhancement type. The same applies to FIG. 8.

The sources of the P-type transistors TA11 and TA12 are coupled to the power supply voltage node NVOUT to which the fourth power supply voltage VOUT is supplied. The drain of the P-type transistor TA11 is coupled to the gates of the P-type transistors TA11 and TA12, the drain of the N-type transistor TA13, and a bias node NVRP1. The source and gate of the N-type transistor TA13 are coupled to a ground node NVSS to which a ground voltage VSS is supplied. The drain of the P-type transistor TA12 is coupled to the drain and gate of the N-type transistor TA14 and a bias node NVNA1. The source of the N-type transistor TA14 is coupled to the ground node NVSS. The ground voltage VSS here may be a power supply voltage lower than the fourth power supply voltage VOUT and the first power supply voltage VDD. Further, in FIG. 7, the reference numerals of the ground voltage VSS and the ground node NVSS are illustrated in only one place as representatives, and the others are omitted. The same applies to FIG. 8.

The bias voltage VRP1 is generated by the drain current of the N-type transistor TA13 flowing through the P-type transistor TA11. The drain current of the N-type transistor TA13 is mirrored by the P-type transistor TA12, and the drain current of the P-type transistor TA12 flows through the N-type transistor TA14, whereby the bias voltage VNA1 is generated. The first bias circuit 191 outputs the bias voltage VNA1 from the bias node NVNA1 to the first comparator 193.

The first power supply voltage VDD is supplied to the first reference voltage generation circuit 192. The first reference voltage generation circuit 192 generates the first reference voltage VREF1 based on the first power supply voltage VDD and outputs the first reference voltage VREF1 to the first comparator 193. The first reference voltage generation circuit 192 includes a P-type transistor TB11, a resistor R1, a resistor R2, and a resistor R3. The first reference voltage generation circuit 192 divides the first power supply voltage VDD by the combined resistance of the resistor R1 and the resistor R2, and the resistor R3, outputs the divided voltage as the first reference voltage VREF1 from a first reference voltage node NVREF1 to a second input node N2 described later. That is, the first reference voltage generation circuit 192 generates the first reference voltage VREF1 and outputs the first reference voltage VREF1 from the first reference voltage node NVREF1. In other words, the first power-on reset circuit 190 includes the first reference voltage generation circuit 192 that outputs a divided voltage of the first power supply voltage VDD as the first reference voltage VREF1. When the first power supply voltage VDD is supplied and the first power-on reset circuit 190 is released, the P-type transistor TB11 is switched from on to off to suppress the current consumption of the first reference voltage generation circuit 192. Further, when the P-type transistor TB11 is reset again by the first power-on reset circuit 190, the P-type transistor TB11 is switched from off to on to prepare for voltage level detection of the first power supply voltage VDD.

The first comparator 193 is operated by being supplied with the first power supply voltage VDD. The first comparator 193 compares the first power supply voltage VDD, which is a voltage to be monitored, with the first reference voltage VREF1 and outputs the result as the first power-on reset signal PORQ1 from an output node NPORQ1. The voltage to be monitored here is a voltage that the first power-on reset circuit 190 monitors in order to determine switching between reset and release from reset. The same applies to FIG. 8. That is, the first comparator 193 compares the first power supply voltage VDD input to a first input node N1 with the first reference voltage VREF1 input to the second input node N2 and outputs the result as the first power-on reset signal PORQ1 from the output node NPORQ1. In other words, the first power-on reset circuit 190 includes the first comparator 193 that is operated by being supplied with the first power supply voltage VDD, in which the first power supply voltage VDD is input to the first input node N1, the first reference voltage VREF1 is input to the second input node N2, and the first power-on reset signal PORQ1 is output from the output node NPORQ1. By doing so, since the first reference voltage VREF1 is generated by the voltage division by the resistor, the responsiveness of the first power-on reset circuit 190 is improved. As a result, even when the first power supply voltage VDD rises rapidly at the initial start-up, since it is possible to output the first power-on reset signal PORQ1 at an appropriate timing, it is possible to perform an appropriate power-on reset operation.

The first comparator 193 includes a first transistor TC11 which is an N-type transistor, a second transistor TC12 which is an N-type transistor, N-type transistors TC13, TC14, TC15, TC16, TD12, and TD14, P-type transistors TC17, TC18, and TC19, and depletion type N-type transistors TD11 and TD13. The sources of the P-type transistors TC17 and TC18 are coupled to the node NVDD to which the first power supply voltage VDD, which is a voltage to be monitored, is supplied. The drain and gate of the P-type transistor TC18 are coupled to the gate of the P-type transistor TC17 and the drain of the second transistor TC12. The drain of the P-type transistor TC17 is coupled to the drain of the first transistor TC11 and the gate of the P-type transistor TC19. The P-type transistors TC17 and TC18 form a current mirror circuit 195. The gate of the second transistor TC12 is coupled to the second input node N2, and the gate of the first transistor TC11 is coupled to the first input node N1. In other words, the first comparator 193 includes the current mirror circuit 195 to which the first power supply voltage VDD is supplied, the first transistor TC11 whose drain is coupled to the current mirror circuit 195 and the first input node N1 serves as a gate node, and the second transistor TC12 whose drain is coupled to the current mirror circuit 195 and the second input node N2 serves as a gate node N2.

Further, the sources of the first transistor TC11 and the second transistor TC12 are coupled to the drain of the N-type transistor TC13. The source of the N-type transistor TC13 is coupled to the drain of the N-type transistor TC14, and the gate is coupled to the bias node NVNA1. The source of the N-type transistor TC14 is coupled to the ground node NVSS, and the gate is coupled to a bias node NVNB1. A bias voltage VNB1 is output to the bias node NVNB1 from a bias circuit (not illustrated). The N-type transistors TC13 and TC14 form the current source of the first comparator 193 and can be referred to as a first current source 196. In other words, the first comparator 193 includes the first current source 196 whose one end is coupled to the source of the first transistor TC11 and the source of the second transistor TC12.

Further, the sources of the first transistor TC11 and the second transistor TC12 are coupled to the drain of the depletion type N-type transistor TD11. The source of the depletion type N-type transistor TD11 is coupled to the drain of the N-type transistor TD12, and the gate is coupled to the ground node NVSS to which the ground voltage VSS is supplied. The gate of the N-type transistor TD12 is coupled to a bias node NVNC, and the source is coupled to the ground node NVSS. The bias voltage VNC is output to the bias node NVNC from a bias circuit (not illustrated). The depletion type N-type transistor TD11 and the N-type transistor TD12 form the current source of the first comparator 193 and can be referred to as a second current source 197. In other words, the first comparator 193 includes the second current source 197 whose one end is coupled to the source of the first transistor TC11 and the source of the second transistor TC12. By further providing the second current source 197 in this way, the responsiveness of the first power-on reset circuit 190 can be improved. At the time of initial startup, it is important to improve the responsiveness of the first power-on reset circuit 190. However, thereafter, since the first power-on reset circuit 190 is not required to have high responsiveness, low power consumption is realized by turning off the second current source 197 as described later.

Further, the drain of the P-type transistor TC19 is coupled to the drain of the depletion-type N-type transistor TD13. The source of the depletion type N-type transistor TD13 is coupled to the drain of the N-type transistor TD14, and the gate is coupled to the ground node NVSS to which the ground voltage VSS is supplied. The gate of the N-type transistor TD14 is coupled to a bias node NVND, and the source is coupled to the ground node NVSS. A bias voltage VND is output to the bias node NVND from a bias circuit (not illustrated). The depletion type N-type transistor TD11 and the N-type transistor TD12 form the current source of the first comparator 193 and can be referred to as a third current source 199. The bias circuit (not illustrated) that outputs the bias voltage VND may be the same as the bias circuit that outputs the bias voltage VNC.

The source of the P-type transistor TC19 is coupled to the node NVDD, and the drain is coupled to the drain of the N-type transistor TC15 and the output node NPORQ1 of the first power-on reset circuit 190. The source of the N-type transistor TC15 is coupled to the drain of the N-type transistor TC16, and the gate is coupled to the bias node NVNA1. The source of the N-type transistor TC16 is coupled to the ground node NVSS, and the gate is coupled to the bias node NVNB1.

The first transistor TC11 and the second transistor TC12 form a differential pair, the second input node N2 corresponds to the negative electrode input node of the first comparator 193, and the first input node N1 corresponds to the positive electrode input node of the first comparator 193. The first reference voltage VREF1 is input to the negative electrode input node, and the first power supply voltage VDD is input to the positive electrode input node. When VDD>VREF1, the first comparator 193 outputs the first power-on reset signal PORQ1 of the first power supply voltage VDD to the output node NPORQ1, and when VDD<VREF1, the first power-on reset signal PORQ1 of the ground voltage VSS is output to the output node NPORQ1.

The above-mentioned second current source 197 may be turned on at the time of initial startup, that is, when the first power supply voltage VDD is applied, and then turned off after the third power-on reset signal PORQ3 from the reset control circuit 129 becomes a high level. In other words, the second current source 197 is turned on when the first power supply voltage VDD is applied and is turned off after the third power-on reset signal PORQ3 becomes a reset release level. By doing so, it is possible to operate the circuit device 100 with low power consumption by turning off an unnecessary current source during a period in which a large amount of current is not required. In other words, the first power-on reset circuit 190 enters a low power consumption mode after the third power-on reset signal PORQ3 becomes a reset release level. As a result, it is possible to perform an appropriate power-on reset operation while appropriately suppressing power consumption. Turning off the current source means turning off the current flowing through the current source.

Similarly, the above-mentioned third current source 199 may be turned on at the time of initial startup, and then turned off after the third power-on reset signal PORQ3 from the reset control circuit 129 becomes a high level. By doing so, it is possible to operate the circuit device 100 with low power consumption by turning off an unnecessary current source during a period in which a large amount of current is not required.

Figure 8:
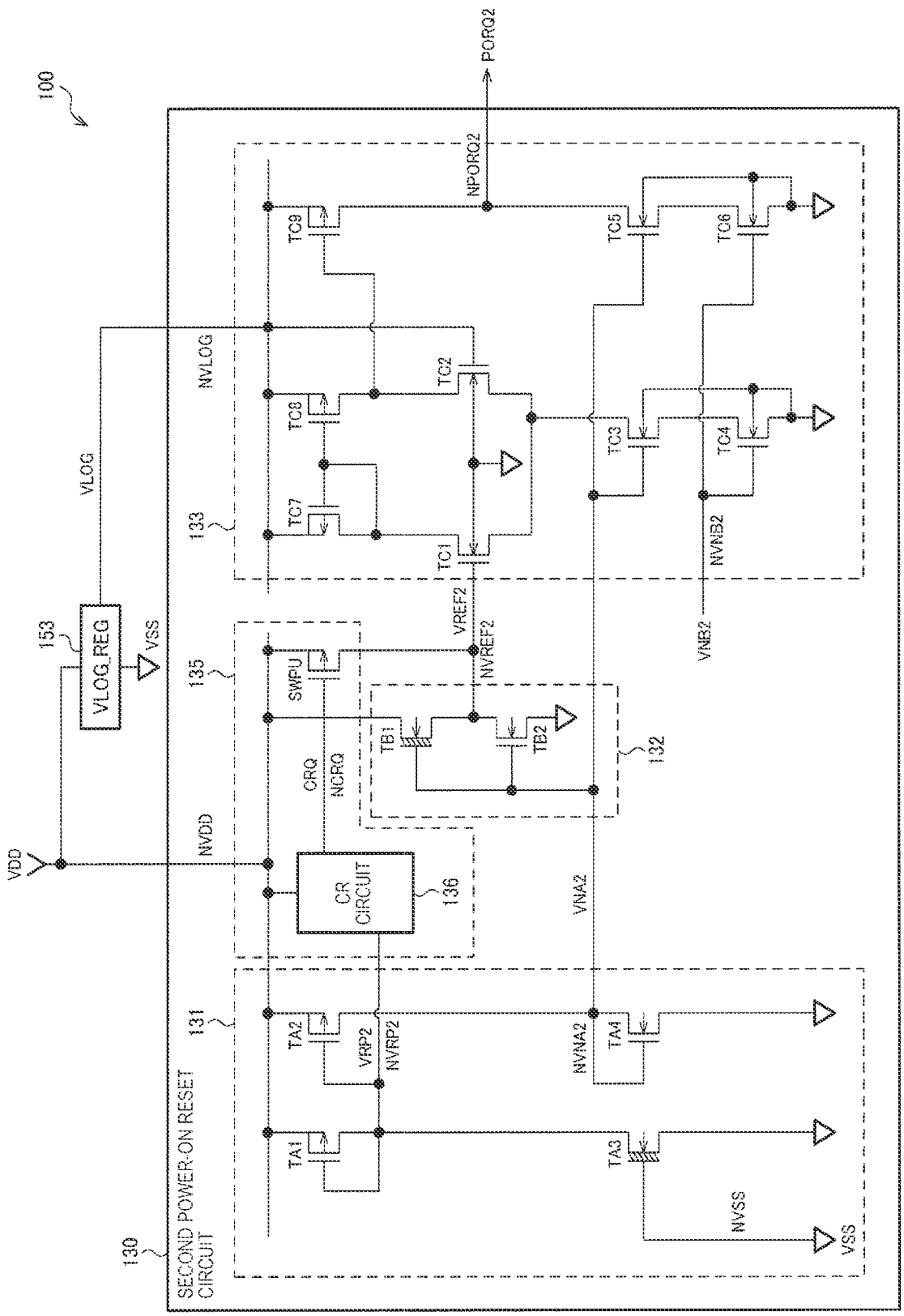
FIG. 8 is a diagram illustrating a configuration example of a second power-on reset circuit.

Next, the second power-on reset circuit 130 will be described with reference to FIG. 8. The second power-on reset circuit 130 includes a second bias circuit 131, a second reference voltage generation circuit 132, a second comparator 133, and a coupling control circuit 135.

The first power supply voltage VDD is supplied to the second bias circuit 131. The second bias circuit 131 generates a bias voltage VNA2 based on the first power supply voltage VDD and outputs the bias voltage VNA2 to the second reference voltage generation circuit 132 and the second comparator 133. The second bias circuit 131 includes P-type transistors TA1 and TA2, a depletion-type N-type transistor TA3, and an N-type transistor TA4.

The sources of the P-type transistors TA1 and TA2 are coupled to the node NVDD to which the first power supply voltage VDD is supplied. The node NVDD here can also be referred to as the first power supply voltage node NVDD. The drain of the P-type transistor TA1 is coupled to the gates of the P-type transistors TA1 and TA2, the drain of the N-type transistor TA3, and a bias node NVRP2. The source and gate of the N-type transistor TA3 are coupled to the ground node NVSS to which the ground voltage VSS is supplied. The drain of the P-type transistor TA2 is coupled to the drain and gate of the N-type transistor TA4 and a bias node NVNA2. The source of the N-type transistor TA4 is coupled to the ground node NVSS. The ground voltage VSS here may be a power supply voltage lower than the first power supply voltage VDD and the third power supply voltage VLOG.

When the drain current of the N-type transistor TA3 flows through the P-type transistor TA1, the bias voltage VRP2 is generated. The second bias circuit 131 outputs the bias voltage VRP2 from the bias node NVRP2 to the coupling control circuit 135 and the second comparator 133. The drain current of the N-type transistor TA3 is mirrored by the P-type transistor TA2, and the drain current of the P-type transistor TA2 flows through the N-type transistor TA4 to generate the bias voltage VNA2. The second bias circuit 131 outputs the bias voltage VNA2 from the bias node NVNA2 to the second reference voltage generation circuit 132 and the second comparator 133.

The third power supply voltage VLOG is supplied to the second reference voltage generation circuit 132 via the regulator VLOG_REG 153. The second reference voltage generation circuit 132 generates the second reference voltage VREF2 based on the third power supply voltage VLOG and outputs the second reference voltage VREF2 to the second comparator 133. The second reference voltage generation circuit 132 includes a depletion type N-type transistor TB1 and an N-type transistor TB2. The drain of the N-type transistor TB1 is coupled to the first power supply voltage node NVDD, and the source is coupled to the drain of the N-type transistor TB2 and a second reference voltage node NVREF2. The source of the N-type transistor TB2 is coupled to the ground node NVSS. The gates of the N-type transistors TB1 and TB2 are coupled to the bias node NVNA2. That is, the second reference voltage generation circuit 132 generates the second reference voltage VREF2 and outputs the second reference voltage VREF2 to the second reference voltage node NVREF2. In other words, the second power-on reset circuit 130 includes the second reference voltage generation circuit 132 that generates the second reference voltage VREF2 and outputs the second reference voltage VREF2 to the second reference voltage node NVREF2.

When the bias voltage VNA is input to the gates of the N-type transistors TB1 and TB2, a current flows through the N-type transistors TB1 and TB2. The second reference voltage VREF2 is determined according to the current and the sizes of the N-type transistors TB1 and TB2. The second reference voltage VREF2 here is a reference voltage after converging to a predetermined voltage. For example, since the current flowing through the N-type transistor TB1 changes by changing the mirror ratio of the N-type transistors TA4 and TB2, the second reference voltage VREF2 can be adjusted. Alternatively, since the source-drain voltage of the N-type transistor TB1 changes by changing the size of the N-type transistor TB1, the second reference voltage VREF2 can be adjusted. The size of the transistor is, for example, the gate length, the gate width, or both.

The third power supply voltage VLOG is supplied to the second comparator 133. The second comparator 133 compares the third power supply voltage VLOG, which is the monitored voltage, with the second reference voltage VREF2 and outputs the result as the second power-on reset signal PORQ2. In other words, the second power-on reset circuit 130 includes the second comparator 133 that outputs the second power-on reset signal PORQ2 by comparing the third power supply voltage VLOG with the second reference voltage VREF2.

The second comparator 133 includes N-type transistors TC1 to TC6 and P-type transistors TC7 to TC9. The sources of the P-type transistors TC7 and TC8 are coupled to a monitored node NVLOG to which the third power supply voltage VLOG, which is a voltage to be monitored, is supplied. The gate and source of the P-type transistor TC7 are coupled to the gate of the P-type transistor TC8 and the drain of the N-type transistor TC1. The drain of the P-type transistor TC8 is coupled to the drain of the N-type transistor TC2 and the gate of the P-type transistor TC9. The sources of the N-type transistors TC1 and TC2 are coupled to the drain of the N-type transistor TC3. The gate of the N-type transistor TC1 is coupled to the second reference voltage node NVREF2, and the gate of the N-type transistor TC2 is coupled to the monitored node NVLOG. The source of the N-type transistor TC3 is coupled to the drain of the N-type transistor TC4, and the gate is coupled to the bias node NVNA2. The source of the N-type transistor TC4 is coupled to the ground node NVSS, and the gate is coupled to a bias node NVNB2. The bias voltage VNB2 is output to the bias node NVNB2 from a bias circuit (not illustrated).

The source of the P-type transistor TC9 is coupled to the monitored node NVLOG, and the drain is coupled to the drain of the N-type transistor TC5 and an output node NPORQ2 of the second power-on reset circuit 130. The source of the N-type transistor TC5 is coupled to the drain of the N-type transistor TC6, and the gate is coupled to the bias node NVNA2. The source of the N-type transistor TC6 is coupled to the ground node NVSS, and the gate is coupled to the bias node NVNB2.

The N-type transistors TC1 and TC2 form a differential pair, the gate of the N-type transistor TC1 corresponds to the negative electrode input node of the second comparator 133, and the gate of the N-type transistor TC2 corresponds to the positive electrode input node of the second comparator 133. The second reference voltage VREF2 is input to the negative electrode input node, and the third power supply voltage VLOG is input to the positive electrode input node. When VLOG>VREF2, the second comparator 133 outputs the second power-on reset signal PORQ2 of the power supply voltage VLOG to the output node NPORQ2, and when VLOG<VREF2, the second power-on reset signal PORQ2 of the ground voltage VSS is output to the output node NPORQ2.

The coupling control circuit 135 includes a CR circuit 136 and a switch SWPU. It is assumed that the switch SWPU includes a transistor and is a P-type transistor here. The source of the P-type transistor constituting the switch SWPU is coupled to the first power supply voltage node NVDD, the drain is coupled to the second reference voltage node NVREF2, and the gate is coupled to a control signal node NCRQ. In other words, the second power-on reset circuit 130 includes the coupling control circuit 135 coupled between the first power supply voltage node NVDD to which the first power supply voltage VDD is supplied and the second reference voltage node NVREF2.

The CR circuit 136 outputs a control signal CRQ that controls the switch SWPU on or off to the control signal node NCRQ based on the first power supply voltage VDD. Although not illustrated, the CR circuit 136 can be realized by including a P-type transistor, an N-type transistor, a capacitor, and an inverter. The CR circuit 136 holds the switch SWPU on by holding the control signal CRQ at a low level for a predetermined period after the first power supply voltage VDD is applied. The CR circuit 136 turns the switch SWPU from on to off by changing the control signal CRQ from a low level to a high level when the predetermined period elapses. It is possible to set the predetermined period by the current value of the constant current flowing through the capacitor and the capacitance value of the capacitor.

That is, the coupling control circuit 135 includes the switch SWPU and the CR circuit 136. The switch SWPU is provided between the first power supply voltage node NVDD and the second reference voltage node NVREF2. The CR circuit 136 outputs a control signal CRQ that controls the switch SWPU from on to off when a predetermined period elapses after the power supply voltage VDD is applied to the switch SWPU. By doing so, since the switch SWPU is turned on for the predetermined period after the power supply voltage VDD is applied, the second reference voltage node NVREF2 is coupled to a first power supply voltage node NVDD2. In other words, the coupling control circuit 135 couples the second reference voltage node NVREF2 and the first power supply voltage node NVDD for a predetermined period after the first power supply voltage VDD is applied. As a result, the second reference voltage VREF2 input to the second comparator 133 becomes the first power supply voltage VDD for the predetermined period after the first power supply voltage VDD is applied. Then, since the switch SWPU is turned from on to off when the predetermined period elapses, the second comparator 133 can compare the second reference voltage VREF2 with the third power supply voltage VLOG which is a voltage to be monitored.

By doing so, even if an unstable behavior such as an overshoot of the third power supply voltage VLOG temporarily occurs, it is possible to release the third power supply voltage VLOG from reset after the predetermined period has elapsed and the third power supply voltage VLOG has stabilized. As a result, it is possible to perform the power-on reset operation synergistically and appropriately.

3. Operation Example According to Present Embodiment

Figure 9:
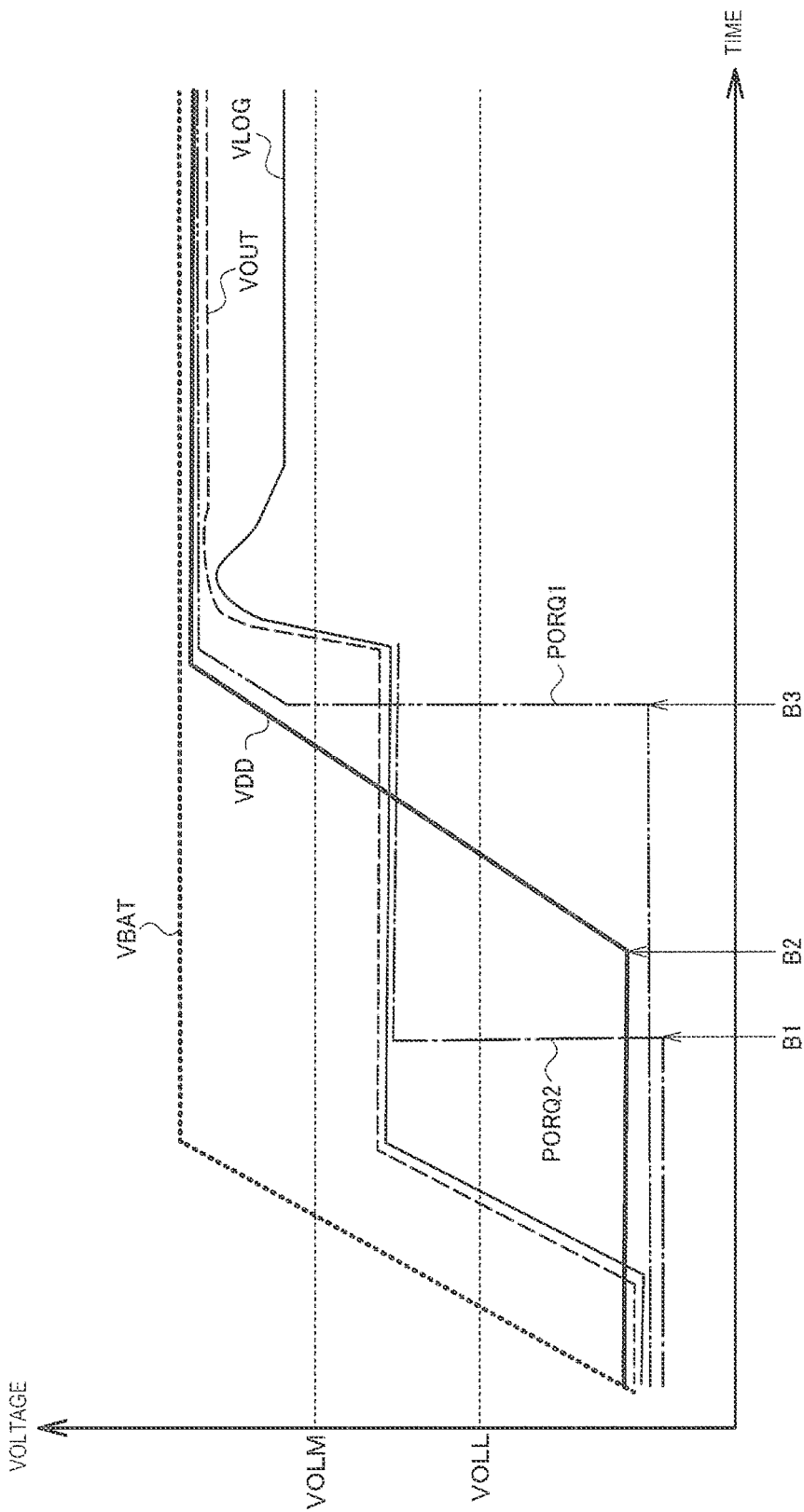
FIG. 9 is a waveform diagram illustrating an operation example in the circuit device of the present embodiment.

Next, an operation example when the circuit device 100 of the present embodiment is applied will be described. FIG. 9 is a diagram illustrating an operation example when the circuit device 100 of the present embodiment is initially started by being coupled to the battery first. In FIG. 9, first, the second power supply voltage VBAT rises, and the fourth power supply voltage VOUT and the third power supply voltage VLOG rise so as to follow the second power supply voltage VBAT. However, the voltage values of the fourth power supply voltage VOUT and the third power supply voltage VLOG are not equal to the second power supply voltage VBAT and drops to a voltage value between the first operation lower limit voltage VOLL and the second operation lower limit voltage VOLM, for example, as illustrated in FIG. 9. This is because the second power supply voltage VBAT is supplied from the second power supply voltage line via the parasitic diodes of the P-type transistors 112 and 113 and is output as the fourth power supply voltage VOUT. Thereafter, at the timing illustrated in B1, the second power-on reset signal PORQ2 from the second power-on reset circuit 130 becomes a high level, which is a reset release level.

In this case, the problem is that the entire circuit of the predetermined circuit 120 is released from reset when the first power supply voltage VDD has not been supplied yet, or the first power supply voltage VDD has not reached the second operation lower limit voltage VOLM. The configuration illustrated in the comparative example cannot solve this problem.

Therefore, by applying the circuit device 100 of the present embodiment, even if the second power-on reset signal PORQ2 becomes a high level at the timing of B1, the memory 127 is not released from reset when it is desired to control the reset at a voltage equal to or higher than the second operation lower limit voltage VOLM. The first power supply voltage VDD starts to rise at the timing of B2 thereafter, the first power supply voltage VDD exceeds the second operation lower limit voltage VOLM, and the first power-on reset signal PORQ1 becomes a high level at the timing of B3 thereafter. As a result, the switch circuit 111 is turned on, and the fourth power supply voltage VOUT and the third power supply voltage VLOG rise. Thereafter, the fourth power supply voltage VOUT becomes equal to the first power supply voltage VDD, and the third power supply voltage VLOG is adjusted to a voltage value lower than the fourth power supply voltage VOUT by the regulator VLOG_REG 153.

As a result, even when the circuit device 100 is started by being coupled to the battery as the backup power supply, since it is possible to release from reset after the first power supply voltage, which is the main power supply, reaches the operation lower limit voltage of the predetermined circuit 120 by the reset control circuit 129, it is possible to perform the power-on reset operation appropriately.

It is desirable to adjust the timing of setting the third power-on reset signal PORQ3 to a high level and inputting the signal to the memory 127 so as to be delayed for a certain period of time from the timing of turning on the switch circuit 111. By doing so, it is possible to release the memory 127 from reset at the timing when the third power supply voltage VLOG exceeds the second operation lower limit voltage VOLM.

Figure 10:
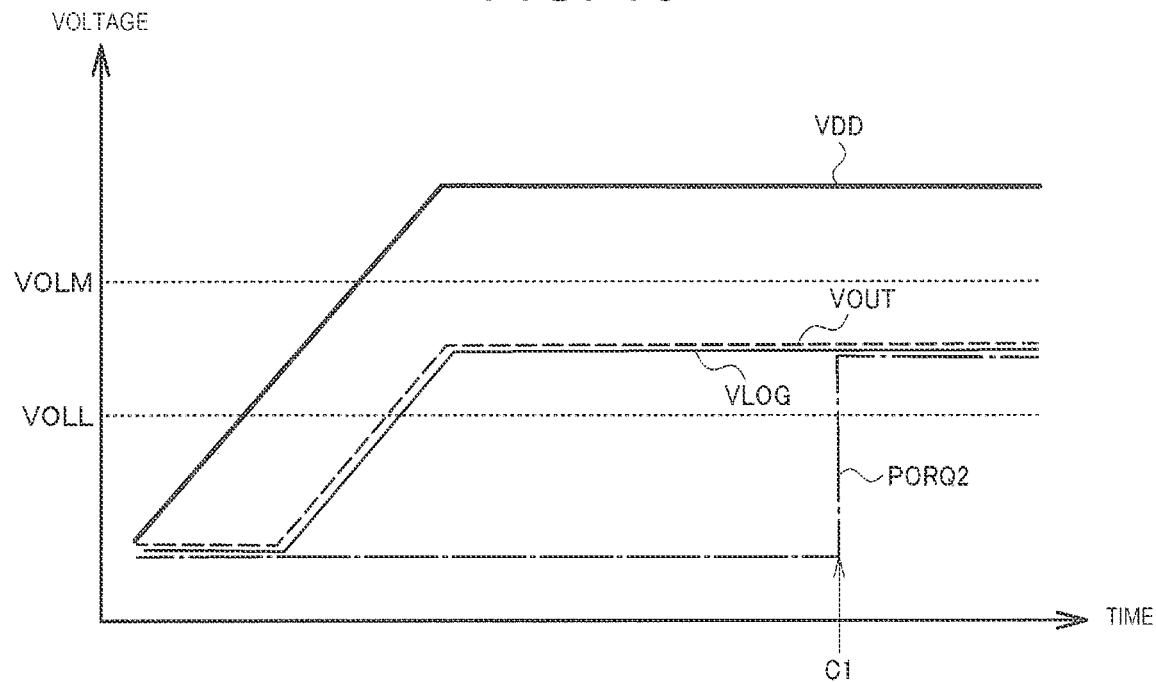
FIG. 10 is a waveform diagram illustrating another operation example in the comparative example.

FIG. 10 is a diagram illustrating an operation when the circuit device 100 is initially started by setting the voltage of the first power supply voltage VDD low in the comparative example of FIG. 1. The first power supply voltage VDD is supplied from the first power supply voltage line via the parasitic diode 322 of the switch circuit 111 and is output as the fourth power supply voltage VOUT. Therefore, similarly to FIG. 9, the voltage values of the fourth power supply voltage VOUT and the third power supply voltage VLOG are not equal to the first power supply voltage VDD and drop to a voltage value between the first operation lower limit voltage VOLL and the second operation lower limit voltage VOLM. In this case, when the second power-on reset signal PORQ2 becomes a high level at the timing of C1, even though the third power supply voltage VLOG does not exceed the second operation lower limit voltage VOLM, the memory 127 is released from reset, which may cause a problem in the memory 127.

Figure 11:
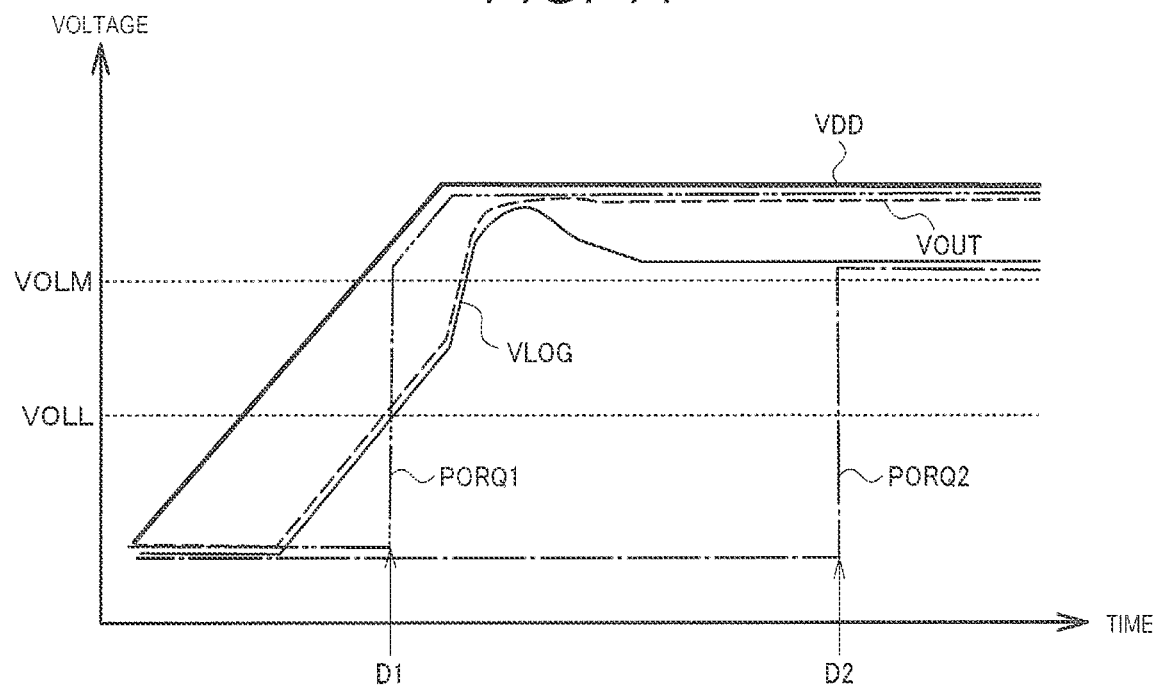
FIG. 11 is a waveform diagram illustrating another operation example in the circuit device of the present embodiment.

FIG. 11 is a diagram illustrating an operation when the circuit device 100 is initially started by applying the voltage of the first power supply voltage VDD to the circuit device 100 of the present embodiment. Since the first power supply voltage VDD rises and the first power-on reset signal PORQ1 becomes a high level at the timing of D1, the switch circuit 111 is turned on. Therefore, the voltage values of the fourth power supply voltage VOUT and the third power supply voltage VLOG rise so as to follow the first power supply voltage VDD. Thereafter, the fourth power supply voltage VOUT becomes equal to the first power supply voltage VDD, and the third power supply voltage VLOG becomes lower than the fourth power supply voltage VOUT by the regulator VLOG_REG 153, but shows a voltage value higher than the second operation lower limit voltage VOLM. Then, at the timing illustrated in D2, the second power-on reset signal PORQ2 becomes a high level, and both the logic circuit 125 and the memory 127 are released from reset. As a result, even in a situation in which the first power supply voltage VDD cannot be set high, it is possible to perform the power-on reset operation appropriately.

The circuit device of the present embodiment described above includes a first power supply line to which a first power supply voltage is supplied, a second power supply line to which a second power supply voltage is supplied, a third power supply line, a power supply circuit, a predetermined circuit, a first power-on reset circuit, a second power-on reset circuit, and a reset control circuit. The power supply circuit is coupled to the first power supply line and the second power supply line, performs selection of the first power supply voltage or the second power supply voltage, and outputs the third power supply voltage based on the selected power supply voltage to the third power supply line. The predetermined circuit is operated by the third power supply voltage. The first power-on reset circuit is coupled to the first power supply line and outputs a first power-on reset signal based on the first power supply voltage. The second power-on reset circuit is coupled to the third power supply line and outputs a second power-on reset signal based on the third power supply voltage. When the first power-on reset signal and the second power-on reset signal becomes a reset release level, the reset control circuit relates to a circuit device that sets the third power-on reset signal output to at least a part of the predetermined circuit to a reset release level.

By doing so, even in a situation where the first power supply voltage cannot be set high, it is possible to operate the power-on reset circuit appropriately by releasing the part of the predetermined circuit from reset after an appropriate voltage value is supplied to the part of the circuit.

Further, the predetermined circuit may include a memory and a logic circuit that performs processing based on data from the memory, and the third power-on reset signal may be input to the memory.

By doing so, when it is desired to start the memory later at the initial startup, since it is possible to release the memory from reset only after the third power-on reset signal is input, it is possible to perform the power-on reset operation appropriately.

Further, the first operation lower limit voltage, which is the operation lower limit voltage of the logic circuit, may be lower than the second operation lower limit voltage, which is the operation lower limit voltage of the memory, and the second power-on reset signal may be input to the logic circuit.

By doing so, since it is possible to release the logic circuit having a low operation lower limit voltage from reset based on the second power-on reset signal, and then to release the memory having a high operation lower limit voltage from reset, it is possible to execute the power-on reset operation appropriately.

Further, the first power supply voltage may be an external power supply voltage input from the outside, and the second power supply voltage may be a battery power supply voltage input from the battery.

By doing so, even if the voltage of the first power supply voltage drops, it is possible to output the third power supply voltage based on the second power supply voltage and to execute the power-on reset operation of the circuit device appropriately.

Further, the circuit device may include the fourth power supply line to which the fourth power supply voltage, which is the power supply voltage based on the selection, is supplied, the power supply circuit may include a switch circuit provided between the first power supply line and the fourth power supply line, and the switch circuit may include a diode whose forward direction is from the first power supply line to the fourth power supply line.

By doing so, it is possible to continue to supply power to the predetermined circuit or the like by passing a current from the first power supply line side to the fourth power supply line regardless of whether the switch circuit is on or off and to perform an appropriate power-on reset operation.

Further, one end of the switch circuit may be coupled to the first power supply line, and the power supply circuit may include a regulator in which the input node is coupled to the other end of the switch circuit and the third power supply voltage is output from the output node.

By doing so, it is possible to generate the third power supply voltage at a desired voltage based on the first power supply voltage, and it is possible to perform an appropriate power-on reset operation.

Further, the switch circuit may be turned from off to on when the first power-on reset signal becomes a reset release level.

By doing so, the third power supply voltage can be raised as the fourth power supply voltage rises so as to be equal to the first power supply voltage. As a result, since it is possible to release the predetermined circuit from reset after supplying a voltage higher than the operation lower limit voltage of each circuit of the predetermined circuit, it is possible to perform an appropriate power-on reset operation.

Further, the first power-on reset circuit may be set to the low power consumption mode after the third power-on reset signal becomes a reset release level.

By doing so, it is possible to perform an appropriate power-on reset operation while appropriately suppressing power consumption.

Further, the first power-on reset circuit may include a first reference voltage generation circuit that outputs a divided voltage of the first power supply voltage as a second reference voltage, and a first comparator that is operated by being supplied with the first power supply voltage, in which the first power supply voltage is input to the first input node, the first reference voltage is input to the second input node, and the first power-on reset signal is output from the output node.

By doing so, since the first reference voltage is generated by the voltage division by the resistor, the responsiveness of the first power-on reset circuit is improved, and it is possible to output the first power-on reset signal at an appropriate timing even when the first power supply voltage rises rapidly, it is possible to perform an appropriate power-on reset operation.

Further, the first comparator may include a current mirror circuit, a first transistor, a second transistor, a first current source, and a second current source. Further, the first power supply voltage may be supplied to the current mirror circuit. Further, the current mirror circuit may be coupled to the drain of the first transistor so that the first input node becomes the gate node of the first transistor. Further, the current mirror circuit may be coupled to the drain of the second transistor so that the second input node becomes the gate node of the second transistor. Further, the source of the first transistor and the source of the second transistor may be coupled to one end of the first current source. Further, the source of the first transistor and the source of the second transistor may be coupled to one end of the second current source. Further, the second current source may be turned on when the first power supply voltage is applied and turned off after the third power-on reset signal becomes a reset release level.

By doing so, the circuit device can be operated with low power consumption by turning off an unnecessary current source during a period in which a large amount of current is not required. As a result, it is possible to perform an appropriate power-on reset operation while appropriately suppressing power consumption.

Further, the second power-on reset circuit may include a second comparator, a second reference voltage generation circuit, and a coupling control circuit. Further, the second comparator may output a second power-on reset signal by comparing the third power supply voltage and the second reference voltage. Further, a second reference voltage may be generated and the second reference voltage may be output to the second reference voltage node. Further, the coupling control circuit may be coupled between the first power supply voltage node to which the first power supply voltage is supplied and the second reference voltage node and couple the second reference voltage node and the first power supply voltage node for a predetermined period after the first power supply voltage is applied.

By doing so, even if the behavior of the third power supply voltage becomes unstable temporarily, since the second power-on reset signal becomes a high level after a predetermined period of time elapses, the power-on reset operation can be synergistically performed appropriately.

Further, the real-time clock device of the present embodiment may include a circuit device and a resonator. Further, the circuit device may include a regulator that generates the third power supply voltage from the power supply voltage output by selecting the first power supply voltage, and an oscillation circuit that generates a clock signal by oscillating the resonator. Further, the predetermined circuit relates to a real-time clock device including a timekeeping circuit that performs timekeeping processing based on a clock signal.

By doing so, the circuit device can be applied to the real-time clock device.

Although the embodiment has been described in detail as above, but those skilled in the art will easily understand that many modifications may be made without deviating practically from the new matters and effects of the present disclosure. Therefore, such modification examples are all included in the scope of the present disclosure.

For example, in the specification or the drawings, terms described with broader or equivalent different terms at least once may be replaced with different terms at any point in the specification or drawings.

In addition, all combinations of the embodiment and modification examples are included in the scope of the present disclosure.

Further, the configuration and operation of the circuit device and the real-time clock device are not limited to those described in the present embodiment, and various modifications can be performed.

What is claimed is:

1. A circuit device comprising:
    a first power supply line to which a first power supply voltage is supplied;
    a second power supply line to which a second power supply voltage is supplied;
    a third power supply line;
    a power supply circuit that is coupled to the first power supply line and the second power supply line, performs selection of the first power supply voltage or the second power supply voltage, and outputs a third power supply voltage based on the selected power supply voltage to the third power supply line;
    a predetermined circuit that is operated by the third power supply voltage;
    a first power-on reset circuit that is coupled to the first power supply line and outputs a first power-on reset signal based on the first power supply voltage;
    a second power-on reset circuit that is coupled to the third power supply line and outputs a second power-on reset signal in response to the third power supply voltage reaching a lower voltage limit, wherein the first power-on reset outputs the first power-on reset signal in response to the first power supply voltage reaching an upper voltage limit greater than the lower voltage limit; and
    a reset control circuit that sets a third power-on reset signal output to at least a part of the predetermined circuit to a reset release level to release the part of the predetermined circuit from a reset state in response to the first power-on reset signal and the second power-on reset signal becoming a reset release level,
    wherein the first power-on reset circuit enters a low power consumption mode after the third power-on reset signal becomes a reset release level.

2. The circuit device according to claim 1, wherein
    the predetermined circuit includes a memory and a logic circuit that performs processing based on data from the memory, and
    the third power-on reset signal is input to the memory.

3. The circuit device according to claim 2, wherein
    a first operation lower limit voltage, which is an operation lower limit voltage of the logic circuit, is lower than a second operation lower limit voltage, which is an operation lower limit voltage of the memory, and
    the second power-on reset signal is input to the logic circuit.

4. The circuit device according to claim 1, wherein
    the first power supply voltage is an external power supply voltage input from an outside, and
    the second power supply voltage is a battery power supply voltage input from a battery.

5. The circuit device according to claim 1, further comprising:
    a fourth power supply line to which a fourth power supply voltage, which is a power supply voltage based on the selection, is supplied,
    the power supply circuit includes a switch circuit provided between the first power supply line and the fourth power supply line, and
    the switch circuit includes a diode whose forward direction is from the first power supply line to the fourth power supply line.

6. The circuit device according to claim 5, wherein
one end of the switch circuit is coupled to the first power supply line, and
the power supply circuit includes a regulator in which an input node is coupled to the other end of the switch circuit and the third power supply voltage is output from an output node.

7. The circuit device according to claim 5, wherein
the switch circuit is turned from off to on when the first power-on reset signal becomes a reset release level.

8. The circuit device according to claim 1, wherein
the first power-on reset circuit includes:
- a first reference voltage generation circuit that outputs a divided voltage of the first power supply voltage as a first reference voltage, and
- a first comparator that is operated by being supplied with the first power supply voltage, in which the first power supply voltage is input to a first input node, the first reference voltage is input to a second input node, and the first power-on reset signal is output from an output node.

9. The circuit device according to claim 8, wherein
the first comparator includes:
- a current mirror circuit to which the first power supply voltage is supplied,
- a first transistor in which a drain is coupled to the current mirror circuit and the first input node serves as a gate node,
- a second transistor in which a drain is coupled to the current mirror circuit and the second input node serves as a gate node,
- a first current source whose one end is coupled to a source of the first transistor and a source of the second transistor, and
- a second current source whose one end is coupled to the source of the first transistor and the source of the second transistor, and
the second current source is turned on when the first power supply voltage is applied and is turned off after the third power-on reset signal becomes a reset release level.

10. The circuit device according to claim 1, wherein
the second power-on reset circuit includes:
- a second comparator that outputs the second power-on reset signal by comparing the third power supply voltage with a second reference voltage,
- a second reference voltage generation circuit that generates the second reference voltage and outputs the second reference voltage to a second reference voltage node, and
- a coupling control circuit that is coupled between a first power supply voltage node to which the first power supply voltage is supplied and the second reference voltage node, and the coupling control circuit couples the second reference voltage node and the first power supply voltage node for a predetermined period after the first power supply voltage is applied.

11. A real-time clock device comprising:
the circuit device according to claim 1; and
a resonator, wherein
the circuit device includes a regulator that generates the third power supply voltage from a power supply voltage output by selecting the first power supply voltage, and an oscillation circuit that generates a clock signal by oscillating the resonator, and
the predetermined circuit includes a timekeeping circuit that performs timekeeping processing based on the clock signal.

12. A circuit device comprising:
a first power supply line to which a first power supply voltage is supplied;
a second power supply line to which a second power supply voltage is supplied;
a third power supply line;
a power supply circuit that is coupled to the first power supply line and the second power supply line, performs selection of the first power supply voltage or the second power supply voltage, and outputs a third power supply voltage based on the selected power supply voltage to the third power supply line;
a predetermined circuit that is operated by the third power supply voltage;
a first power-on reset circuit that is coupled to the first power supply line and outputs a first power-on reset signal based on the first power supply voltage;
a second power-on reset circuit that is coupled to the third power supply line and outputs a second power-on reset signal in response to the third power supply voltage reaching a lower voltage limit, wherein the first power-on reset outputs the first power-on reset signal in response to the first power supply voltage reaching an upper voltage limit greater than the lower voltage limit; and
a reset control circuit that sets a third power-on reset signal output to at least a part of the predetermined circuit to a reset release level to release the part of the predetermined circuit from a reset state in response to the first power-on reset signal and the second power-on reset signal becoming a reset release level,
wherein the first power-on reset circuit only receives the first power supply voltage as first circuit operating power via the first power supply line, and
the second power-on reset circuit only receives the third power supply voltage as second circuit operating power via the third power supply line.

* * * * *